(12) United States Patent
Peng et al.

(10) Patent No.: US 6,221,731 B1
(45) Date of Patent: *Apr. 24, 2001

(54) PROCESS OF FABRICATING BURIED DIFFUSION JUNCTION

(75) Inventors: Nai-Chen Peng; Ming-Tzong Yang, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/063,022

(22) Filed: Apr. 20, 1998

(30) Foreign Application Priority Data

Jan. 12, 1998 (TW) .................................................. 87100301

(51) Int. Cl.$^7$ .................................................. H01L 21/76
(52) U.S. Cl. ........................... 438/400; 438/439; 438/425
(58) Field of Search .................................. 438/400, 439, 438/425, 424

(56) References Cited

U.S. PATENT DOCUMENTS

| | | | | |
|---|---|---|---|---|
| 5,677,232 | * | 10/1997 | Kim et al. ............................. | 438/400 |
| 5,858,842 | * | 1/1999 | Park ..................................... | 438/297 |
| 5,911,110 | * | 6/1999 | Yu ......................................... | 438/424 |
| 6,020,251 | * | 2/2000 | Peng et al. ........................... | 438/425 |

* cited by examiner

*Primary Examiner*—Caridad Everhart

(57) ABSTRACT

A process is disclosed for fabricating buried diffusion junction that can be combined with the shallow-trench isolation for the memory device cell unit transistor wherein both the junction and the isolation can be formed in the same layout. The buried diffusion is free from being inadvertently cut apart to cause open-circuiting. A bird's beak oxide layer is formed protecting the buried diffusion junction region from undesirable etching, thereby preventing from damaging consumption by etching. The buried diffusion junctions formed may serve as the source/drain region for the transistor.

16 Claims, 2 Drawing Sheets

US 6,221,731 B1

PROCESS OF FABRICATING BURIED DIFFUSION JUNCTION

CROSS-REFERENCE TO RELATED APPLICATION

This application claims the priority benefit of Taiwan application Serial No. 87100301, filed Jan. 12, 1998, the full disclosure of which is incorporated herein by reference.

BACKGROUND OF THE INVENTION

1. Field of the Invention

This invention relates in general to a process of fabricating semiconductor IC devices and, in particular, to a process of fabricating buried diffusion junction thereof. More particularly, this invention relates to a process of fabricating buried diffusion junction in combination with the shallow-trench isolation for memory device cell unit transistors.

2. Description of Related Art

Buried diffusion junctions in IC devices are generally fabricated selfaligned with the transistor source/drain regions of cell units of memory devices, thereby forming continuous interleaving regions of the buried diffusion junction and the shallow-trench isolation. The buried diffusion junction regions thus formed constitute the source/drain regions for the device transistor. Among each pair of these source/drain regions, one of them can be utilized to connect directly to the bitline for the transistor-based cell unit.

MOS transistors in semiconductor IC memory devices can be considered as a four-terminal device including a gate and a pair of source/drain terminals. In a complete semiconductor memory IC device, consecutive MOS transistors must be isolated from each other utilizing electrical isolation structures to avoid mutual electrical short-circuiting. In general, a technique of local oxidation of silicon (LOCOS) is frequently employed to form device isolation regions underneath the surface of the device substrate by forming a thick layer of oxide. As the technique of LOCOS matures, low-cost, effective and reliable device isolation structures are thus possible.

However, there are still some disadvantages with LOCOS. Among the most obvious, problems in relation to the accumulation of mechanical stresses as well as the formation of bird's beak surrounding the isolation regions are the most noticeable. The problem caused by the formation of bird's beak, in particular, renders the reduced effectiveness of LOCOS isolation regions in small-sized devices. In order to solve this problem, conventional practices have employed the use of shallow-trench isolation structures for small devices. The advantage of larger thickness of shallow-trench isolation structures not only assists in improved isolation, but it also provides rigid and planar surface for the isolation structure.

Conventionally, bitlines leading to the memory cell units are electrically connected to the corresponding source/drain regions of the transistors by metallization via contact holes formed in the insulation layer. However, as the technology of device integration advances, device dimensions are reduced. Refined fabrication resolution thus brings increased difficulties in implementing the necessary alignment for the contact holes with respect to their corresponding transistor source/drain regions. Buried bitlines thus provides as a form of more reliable and easier-to-implement electrical connection to the cell unit transistors. Moreover, buried bitlines occupy no additional device surface area which is a fact advantageous in improving device integration densities.

However, conventional arrangement for buried diffusion junction and shallow-trench isolation can not allow them to be present on the same layout. If the fabrication procedure for buried diffusion junction is combined with that for the shallow-trench isolation, the buried diffusion junctions will be cut in parts by the presence of shallow-trench isolation regions. This constrains the employment of buried diffusion junctions in devices installing shallow-trench isolations. Meanwhile, conventional buried bitlines are fabricated after the formation of the main structure of the transistors which is a practice that adds to the complexity of the entire device fabrication procedure.

SUMMARY OF THE INVENTION

It is therefore an object of the invention to provide a process for fabricating buried diffusion junction that can be combined with the shallow-trench isolation for the memory device cell unit transistor wherein both the junction and the isolation can be formed in the same layout.

It is another object of the present invention to provide a process for fabricating buried diffusion junction in combination with shallow-trench isolation for the memory device cell unit transistor wherein the junction is free from being inadvertently cut apart to cause open-circuiting.

The present invention achieves the above-identified objects by providing a process for fabricating a buried diffusion junction for a semiconductor integrated circuit device. The process includes the step of forming a first oxide layer over the surface of the device substrate, followed by the formation of a patterned silicon nitride layer, and the silicon nitride layer reveals the surface of the first oxide layer. An ion implantation region is then formed in the device substrate in the region underneath the revealed first oxide layer. The first oxide layer is then further oxidized again to form a second oxide layer and also turns the ion implantation region underneath the second oxide layer into a buried diffusion junction. The silicon nitride layer is then patterned covering the device active region, thereby exposing portions of the first oxide layer. A shallow-trench isolation region is then formed in the device substrate by performing an etching procedure utilizing the second oxide layer and the silicon nitride layer as shielding mask.

BRIEF DESCRIPTION OF THE DRAWINGS

Other objects, features, and advantages of the present invention will become apparent by way of the following detailed description of the preferred but nonlimiting embodiments. The description is made with reference to the accompanying drawings in which.

DESCRIPTION OF THE PREFERRED EMBODIMENT

The process for fabricating buried diffusion junction of the invention is combined with the fabrication for shallow-trench isolation, allowing both to be arranged on the same layout. This is achieved by forming an implantation region and then subsequently an etch-mask before the formation of the shallow-trench isolation structure. The presence of the etching-mask protects against etching as the shallow-trench isolation is being fabricated. Open-circuiting caused by etching-through can thus be prevented. The implantation region becomes the buried diffusion junction after the thermal treatment with heated gaseous flow. The buried diffusion junctions formed in the fabrication process of the invention are utilized as the source/drain regions of the device transistors, in which one of the two source/drain regions in each transistor is connected to the bitline.

Figure 1:
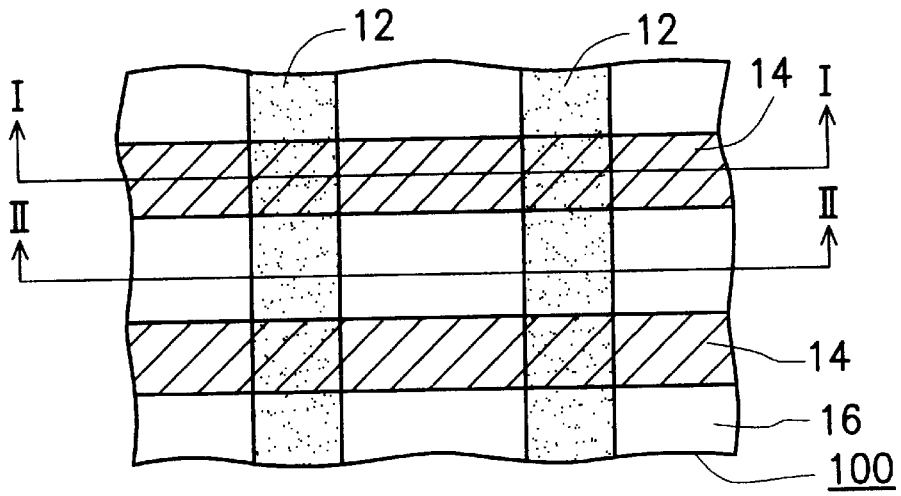
FIG. 1 schematically outlines the layout of the combination of the buried diffusion junction region and the shallow-trench isolation region for a device cell unit.

FIG. 1 of the drawing schematically outlines in a simplified manner the layout of the combination of the buried diffusion junction and the shallow-trench isolation region for a memory device cell unit. As persons skilled in the art should be able to appreciate, substantial configuration in a cell unit for the memory device is much more complicated than what is schematically shown in the drawing.

As is illustrated, source/drain regions 12 for the device transistor are first defined in the device substrate 100. One of the two source/drain regions 12 is going to be connected directly to the bitline that addresses the very memory cell unit examined. Other than the source/drain regions 12, an active region 14 is also defined for each of the transistor unit. The region designated for the active region 14 not overlapping with the source/drain region 12 may be used to form the gate structure for the transistor. Those areas not defined for the source/drain region 12 and the active region 14 are assigned for the shallow-trench isolation, as are identified by reference numeral 16. The cross-sectional view taken along the I—I line in FIG. 1 shows the structural configuration of the device active region. The device fabricated in accordance with the process of the invention is described with reference to FIGS. 2A~2E, in which cross-sectional views of the device in the selected process stages of its fabrication are depicted.

Figure 2A:
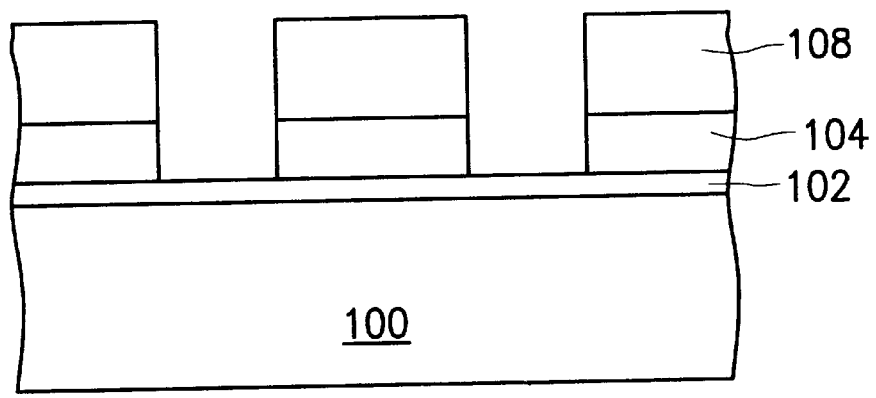
FIGS. 2A~2E respectively depict the cross-sectional views of the transistor device featuring the buried diffusion junction and the shallow-trench isolation fabricated in accordance with a preferred embodiment of the invention.

As is illustrated in FIG. 2A, a pad oxide layer 102 is formed over the surface of the device substrate 100 in, for example, a thermal oxidation procedure. A silicon nitride layer 104 then forms on top of the pad oxide layer 102 in, for example, a chemical vapor deposition (CVD) procedure. Then, a patterning photoresist layer 108 can be used as a shielding mask for the implementation of an etching procedure that etches into the silicon nitride layer 104. The etching is stopped when the surface of the pad oxide layer 102 is exposed. The regions underneath these blocks of exposed pad oxide layer 102 are where the buried diffusion junctions are to be formed.

Then, these exposed blocks of pad oxide layer 102 may be used to provide the channeling effect for the implementation of an ion implantation procedure, in which the depth to which ions are implanted may be controlled. The impurities used for the implantation may be arsenic, or other materials with similar characteristics. The implantation energy level is about 40~80 keV, achieving an impurity concentration of about 1E15~4E15 ions/cm$^2$. As a result of this ion implantation, the regions containing the implanted ion impurities become electrically more conductive. At this stage, due to the fact that active regions have not yet been defined, the cross-sectional configuration of the device along both the I—I and the II—II lines are substantially the same. Note that these implantation regions are not identified in the drawing of FIG. 2A.

Figure 2B:
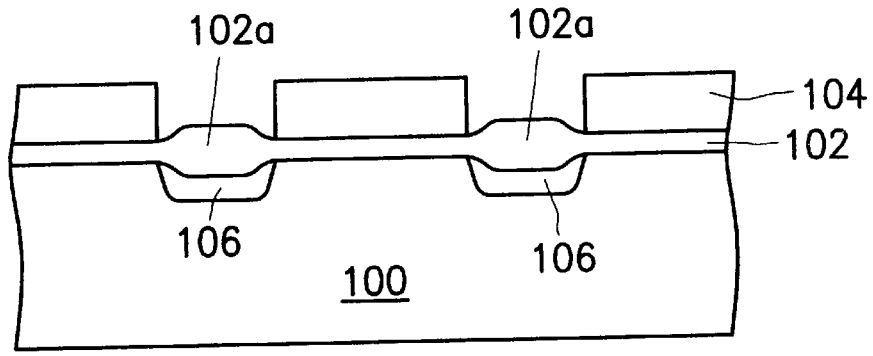

Refer to FIG. 2B. The photoresist layer 108 (of FIG. 2A) is then removed, and the silicon nitride layer 104 is utilized as a shielding mask for the implementation of an oxidation procedure. Portions of the pad oxide layer 102 exposed out of the coverage of the silicon nitride layer 104 are oxidized further in, for example, a wet oxidation procedure, increasing the thickness thereof to a range of about 600~2,000 Å, and revealing the bird's beak configuration as outlined in the cross-sectional view of FIG. 2B by reference numeral 102a.

Those regions of the device substrate 100 underneath the exposed pad oxide layer 102a for FIG. 2B that were subject to the ion implantation are now turned into the buried diffusion junctions 106 as a result of the high temperature of the oxidation procedure that formed the bird's beaks. These buried diffusion junctions 106 constitute the source/drain regions for the device cell unit transistors.

The bird's beaks 102a may then be used to provide masking for the buried diffusion junction regions 106 underneath in the subsequent etching procedures so that each of these junction regions 106 remains intact without being cut apart. Again, since the active regions 14 of FIG. 2A are not yet defined, the cross-sectional configuration of the device along both the I—I and the II—II lines of FIG. 1 are substantially the same.

Figure 2C:
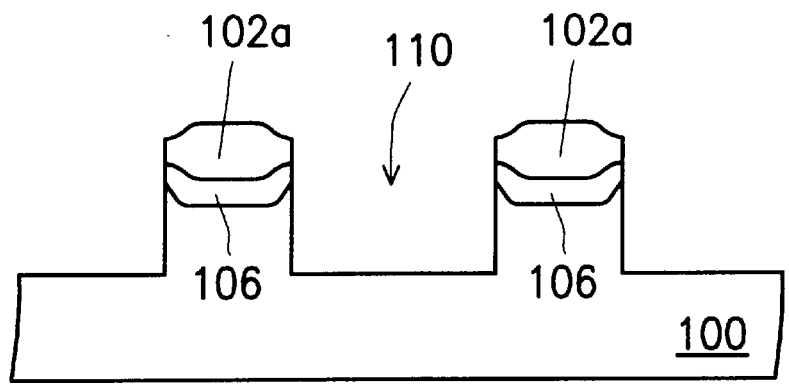

Then, refere simultaneously to FIGS. 2B and 2C. It should be pointed out that FIG. 2B is the cross-sectional view of the device taken along the I—I line of FIG. 1 while FIG. 2C along the II—II line. Another photoresist layer not shown in the drawing is deployed again over the surface of the device substrate at this stage. This photoresist layer is patterned to define the active regions 14, as that outlined in the top view of FIG. 1. Thus, the surface of the device shown in the cross-sectional view of FIG. 2B is covered by this photoresist layer, although not explicitly shown.

With the presence of this photoresist layer, a dry etching procedure is then conducted to etch into the surface configuration of the device at this stage. This dry etching is conditioned to exhibit good selectivity against both the oxide and the nitride layers. Thus, the silicon nitride layer 104 not being covered by the photoresist layer is removed in the dry-etching procedure, revealing the surface of the pad oxide layer 102 underneath. A subsequent treatment with an etchant such as an HF solution then removes the residual pad oxide layer 102.

Then, yet another etching procedure is employed again which etches into the device substrate 100 in regions not being covered by the bird's beak shaped oxide layer 102a, as well as regions not being covered by the photoresist layer. The result is the formation of the shallow trench 110 as is outlined in FIG. 2C. Note that the cross-sectional view of FIG. 2C is taken along the II—II line of FIG. 1. At this stage, the photoresist layer can then be removed, and the cross-sectional view of the device taken along the I—I line of FIG. 1 is substantially the same as that of FIG. 2B.

It can be emphasized that during the formation of the shallow trench 110 (FIG. 2C), since the buried diffusion junctions 106 are well protected by their corresponding bird's beak-shaped oxide layer 102a, they therefore remain intact without the damages by the etching. Open-circuiting is thus prevented.

Figure 2D:
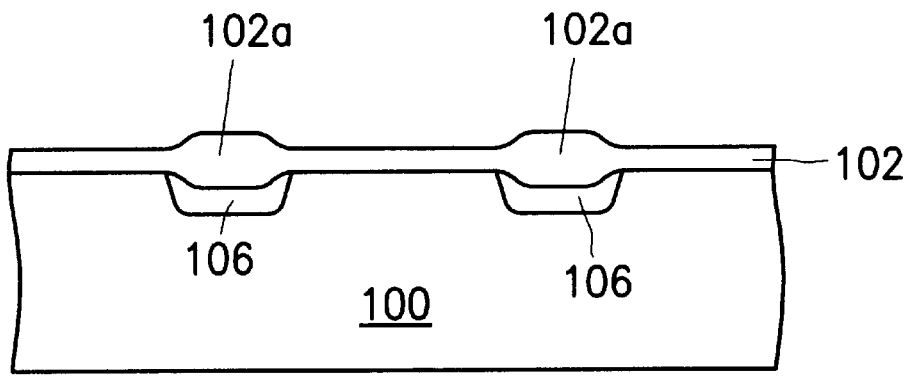
Figure 2E:
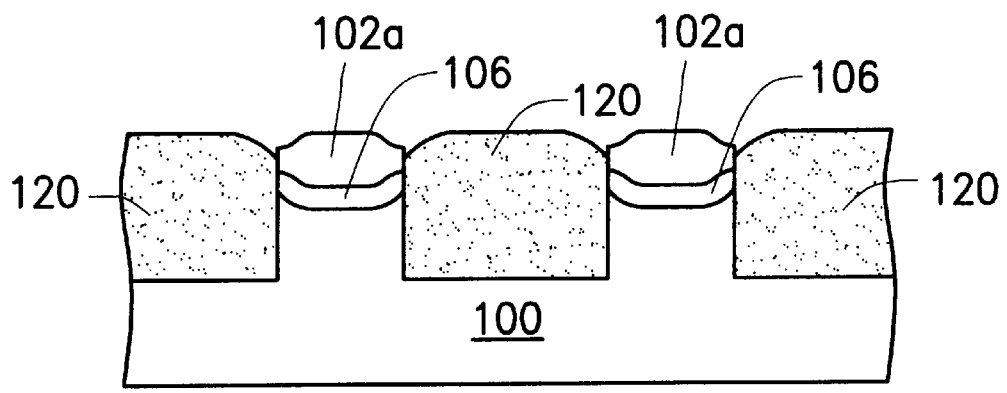

Next, reference is directed to FIGS. 2D and 2E simultaneously. Note again that FIG. 2D shows the cross-sectional view of the device taken along line I—I of FIG. 1, depicting the structure of the active region 14 of the device, while FIG. 2E is taken along II—II that depicts the region of the shallow-trench isolation regions. To obtain the configuration of FIGS. 2D and 2E, a liner oxide layer not shown in the drawing is first formed on the sidewall as well as on the bottom surface of the shallow trench 110. An annealing procedure then follows to cure to an extent as great as possible those portions of the configuration damaged in the previous etching procedures.

Next, the trenches 110 are filled with a dielectric material such as TEOS (tetra-ethyl-ortho-silicate) oxide formed in an atmospheric pressure CVD (APCVD) procedure utilizing a TEOS-containing gaseous supply. The TEOS oxide fills inside the trenches 110 to an extent substantially overflowing out of the trenches. The TEOS oxide formed in the trenches 110 may then be subject to a densification treatment, which causes contraction in the TEOS oxide. Next, a chemical-mechanical polishing (CMP) procedure may be employed to generally planarize the surface of the device substrate, leaving the TEOS contact plug installed inside the trenches 110, as is schematically outlined in the cross-sectional view of FIG. 2E. Then, an acid solution such as a hot phosphoric acid ($H_3PO_4$) solution may be employed to remove the silicon nitride layer 104, until the pad oxide layer 102 underneath is revealed. After this, the normal procedural steps for the fabrication of the transistor device can be performed subsequently.

Thus, the process of the invention for the fabrication of combined buried diffusion junction and shallow-trench isolation for memory device cell unit transistors is advantageous in that buried diffusion junctions are free of being undesirably cut apart to cause open-circuiting. Comparable prior-art fabrication technique for making the combination of buried diffusion junction and shallow-trench isolation can not avoid this open-circuiting phenomenon. The inventive fabrication procedure achieves this by forming the buried diffusion junction that is protected by a shielding etching-mask in advance to the fabrication of the shallow-trench isolation configuration. With the protection of the etch shielding mask, the buried diffusion junction may remain untouched by the etching, thereby preserving its integrity. Moreover, the buried diffusion junction can be both the source/drain region for the cell unit transistor as well as the bitline that leads electrically to one of the source/drain regions.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating a buried diffusion junction for a semiconductor integrated circuit device comprising the steps of:
   a. forming a first oxide layer over the surface of the device substrate, followed by the formation of a patterned silicon nitride layer, and the silicon nitride layer revealing the surface of the first oxide layer;
   b. forming an ion implantation region in the device substrate in the region underneath the revealed first oxide layer;
   c. oxidizing the revealed first oxide layer to form a second oxide layer and turning the ion implantation region underneath the second oxide layer into a buried diffusion junction;
   d. patterning the patterned silicon nitride layer to cover the device active region, thereby exposing portions of the first oxide layer; and
   e. forming a shallow-trench isolation region in the device substrate by performing an etching procedure utilizing the second oxide layer and the silicon nitride layer as shielding mask.

2. The process for fabricating buried diffusion junction according to claim 1, wherein step b comprises implanting ions of impurity into the ion implantation region utilizing the silicon nitride layer as a shielding mask.

3. The process for fabricating buried diffusion junction according to claim 2, wherein the impurity ion is arsenic ion.

4. The process for fabricating buried diffusion junction according to claim 1, wherein step c comprises oxidizing the first oxide layer to form a second oxide layer in a wet oxidation procedure under high temperature.

5. The process for fabricating buried diffusion junction according to claim 1, wherein the second oxide layer formed in step c is thicker than the first oxide layer and having a thickness of about 600~2,000 Å.

6. The process for fabricating buried diffusion junction according to claim 4, wherein step c comprises heating at high temperature to turn the ion implantation region underneath the second oxide layer into a buried diffusion junction.

7. The process for fabricating buried diffusion junction according to claim 1, wherein step e further comprises:
   a. forming a trench constituting the shallow-trench isolation in the device substrate utilizing the silicon nitride layer as a shielding mask for the implementation of an etching procedure;
   b. forming a third oxide layer over the surface inside the trench;
   c. depositing a dielectric material inside the trench to an extent in which the deposition overflows the trench;
   d. densifying the deposited dielectric material; and
   e. implementing a chemical-mechanical polishing procedure against the surface of the device substrate.

8. The process for fabricating buried diffusion junction according to claim 7, wherein step a further comprises:
   a. etching the revealed first oxide layer utilizing the silicon nitride layer as a shielding mask; and
   b. forming the trench by further etching into the device substrate.

9. The process for fabricating buried diffusion junction according to claim 8, wherein the first oxide layer is etched by an HF acid solution.

10. The process for fabricating buried diffusion junction according to claim 8, wherein the device substrate is etched in a dry-etching procedure.

11. The process for fabricating buried diffusion junction according to claim 7, wherein the third oxide layer is formed in a thermal oxidation procedure.

12. The process for fabricating buried diffusion junction according to claim 7, wherein the dielectric material is tetra-ethyl-ortho-silicate oxide.

13. The process for fabricating buried diffusion junction according to claim 12, wherein the tetra-ethyl-ortho-silicate oxide is formed by implementing a chemical vapor deposition procedure utilizing a tetra-ethyl-ortho-silicate-containing gaseous supply.

14. The process for fabricating buried diffusion junction according to claim 7, wherein the chemical-mechanical polishing procedure removes the portion of the dielectric material overflowing out of the trench.

15. The process for fabricating buried diffusion junction according to claim 1, wherein step e further comprises removing the silicon nitride layer.

16. The process for fabricating buried diffusion junction according to claim 15, wherein the silicon nitride layer is removed by etching in a hot phosphoric acid solution.

* * * * *